US009619607B2

(12) United States Patent
Tao et al.

(10) Patent No.: US 9,619,607 B2
(45) Date of Patent: Apr. 11, 2017

(54) METHOD AND APPARATUS FOR COST FUNCTION BASED SIMULTANEOUS OPC AND SBAR OPTIMIZATION

(71) Applicant: ASML NETHERLANDS B.V., Veldhoven (NL)

(72) Inventors: Jun Tao, Milpitas, CA (US); Been-Der Chen, Milpitas, CA (US); Yen-Wen Lu, Los Altos, CA (US); Jiangwei Li, Palo Alto, CA (US); Min-Chun Tsai, San Jose, CA (US); Dong Mao, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 87 days.

(21) Appl. No.: 14/462,187

(22) Filed: Aug. 18, 2014

(65) Prior Publication Data

US 2014/0359543 A1    Dec. 4, 2014

Related U.S. Application Data

(63) Continuation of application No. 13/537,005, filed on Jun. 28, 2012, now Pat. No. 8,812,998.

(Continued)

(51) Int. Cl.
*G06F 17/50* (2006.01)
*G03F 1/70* (2012.01)
*G03F 7/20* (2006.01)

(52) U.S. Cl.
CPC ............ *G06F 17/5081* (2013.01); *G03F 1/70* (2013.01); *G03F 7/70441* (2013.01)

(58) Field of Classification Search
CPC ........ G03F 1/36; G03F 1/144; G03F 7/70466; G03F 7/70441; G03F 7/70433; G06F 17/5072

(Continued)

(56) References Cited

U.S. PATENT DOCUMENTS 7,707,538 B2    4/2010  Wong et al.
7,954,073 B2    5/2011  Park
(Continued)

FOREIGN PATENT DOCUMENTS

JP    2009-058957    3/2009
WO    2007/010621    1/2007
WO    2010/059954    5/2010

OTHER PUBLICATIONS

R. Socha, "Resolution Enhancement Techniques," Photomask Fabrication Technology, Benjamin G. Eynon Jr. and Banqiu Wu, Editors, McGraw-Hill, pp. 466-468 (2005).

(Continued)

*Primary Examiner* — Nghia Doan
(74) *Attorney, Agent, or Firm* — Pillsbury Winthrop Shaw Pittman LLP

(57) ABSTRACT

Described herein is a method for obtaining a preferred layout for a lithographic process, the method comprising: identifying an initial layout including a plurality of features; and reconfiguring the features until a termination condition is satisfied, thereby obtaining the preferred layout; wherein the reconfiguring comprises evaluating a cost function that measures how a lithographic metric is affected by a set of changes to the features for a plurality of lithographic process conditions, and expanding the cost function into a series of terms at least some of which are functions of characteristics of the features.

25 Claims, 10 Drawing Sheets

Related U.S. Application Data

(60) Provisional application No. 61/650,346, filed on May 22, 2012, provisional application No. 61/504,037, filed on Jul. 1, 2011.

(58) Field of Classification Search
USPC .................................. 716/50–55; 430/5, 30
See application file for complete search history.

(56) References Cited

U.S. PATENT DOCUMENTS

| | | |
|---|---|---|
| 8,239,786 B2 | 8/2012 | Wong et al. |
| 8,279,409 B1 | 10/2012 | Sezginer et al. |
| 8,336,006 B2 | 12/2012 | Kodera et al. |
| 2002/0127479 A1* | 9/2002 | Pierrat ...................... G03F 1/30 430/5 |
| 2010/0161093 A1 | 6/2010 | Wong et al. |

OTHER PUBLICATIONS

Alfred Kwok-Kit Wong, "Resolution Enhancement Techniques in Optical Lithography," SPIE Press, Tutorial Texts in Optical Engineering, vol. TT47, pp. 91-115 (2001).

Shimon Maeda et al., "Ultimately accurate SRAF replacement for practical phases using an adaptive search algorithm based on the optimal gradient method," Optical Microlithography XXIII, Proc. of SPIE, vol. 7640, pp. 764018-1-764018-12 (2010).

Ma et al., "Pixel-based OPC optimization based on conjugate gradients," Optics Express, pp. 2165-2180 (Jan. 2011).

* cited by examiner

METHOD AND APPARATUS FOR COST FUNCTION BASED SIMULTANEOUS OPC AND SBAR OPTIMIZATION

CROSS-REFERENCE TO RELATED APPLICATIONS

This application is a Continuation of U.S. patent application Ser. No. 13/537,005, filed Jun. 28, 2012, (Now U.S. Pat. No. 8,812,998), which claims priority to U.S. Provisional Application No. 61/504,037, filed Jul. 1, 2011, and also claims priority to U.S. Provisional Application No. 61/650,346, filed May 22, 2012, each of which are incorporated herein by reference in their entirety.

BACKGROUND

In the semiconductor industry, microlithography (or simply lithography) is the process of printing circuit patterns on a semiconductor wafer (for example, a silicon or GaAs wafer). Currently, optical lithography is the predominant technology used in volume manufacturing of semiconductor devices and other devices such as flat-panel displays. Such lithography employs light in the visible to the deep ultraviolet spectral range to expose photosensitive resist on a substrate. In the future, extreme ultraviolet (EUV) and soft x-rays may be employed. Following exposure, the resist is developed to yield a relief image.

In optical lithography, a photomask (often called a mask or a reticle) that serves as a template for the device structures to be manufactured is first written using electron-beam or laser-beam direct-write tools. A typical photomask for optical lithography consists of a glass (or quartz) plate of six to eight inches on a side, with one surface coated with a thin metal layer (for example, chrome) of a thickness of about 100 nm. The device pattern is etched into the metal layer, hence allowing light to transmit through the clear areas. The areas where the metal layer is not etched away block light transmission. In this way, a pattern may be projected onto a semiconductor wafer.

The mask contains certain patterns and features that are used to create desired circuit patterns on a wafer. The tool used in projecting the mask image onto the wafer is called a "stepper" or "scanner" (hereinafter collectively called "exposure tool"). FIG. 1 is a diagram of an optical projection lithographic system 10 of a conventional exposure tool. System 10 includes an illumination source 12, an illumination pupil filter 14, a lens subsystem 16a-c, a mask 18, a projection pupil filter 20, and a wafer 22 on which the aerial image of mask 18 is projected. Illumination source 12 may operate, for example, at UV (ultra-violet), DUV (deep ultra-violet) or EUV wavelengths. The light beam of illumination source 12 is expanded and scrambled before it is incident on illumination pupil 14. Illumination pupil 14 may be a simple round aperture, or may have specifically designed shapes for off-axis illumination. Off-axis illumination may include, for example, annular illumination (i.e., illumination pupil 14 is a ring with a designed inner and outer radii), quadruple illumination (i.e., illumination pupil 14 has four openings in the four quadrants of the pupil plane), and others such as dipole illumination.

After illumination pupil 14, the light passes through the illumination optics (for example, lens subsystem 16a) and is incident on mask 18, which contains the circuit pattern to be imaged on wafer 22 by the projection optics. As the desired pattern size on wafer 22 becomes smaller and smaller, and the features of the pattern become closer and closer to each other, the lithography process becomes more challenging. The projection optics (for example, lens subsystems 16b and 16c, and projection pupil filter 20) images mask 18 onto wafer 22. Pupil 20 of the projection optics limits the maximum spatial frequency of the mask pattern that can be passed through the projection optics system. A number called "numerical aperture" or NA often characterizes pupil 20.

When the resist is exposed by the projected image and thereafter baked and developed, the resist tends to undergo complex chemical and physical changes. The final resist patterns are typically characterized by their critical dimensions, or CD, usually defined as the width of a resist feature at the resist-substrate interface. While the CD is usually intended to represent the smallest feature being patterned in the given device, in practice the term CD is used to describe the linewidth of any resist feature.

In most exposure tools, the optical system reduces the size of the pattern from the mask level to the wafer level by a reduction factor, typically 4 or 5. Because of this the pattern at the mask level is typically larger than the desired pattern at the wafer level, which relaxes the dimensional control tolerances required at the mask level and improves the yield and manufacturability of the mask-making process. This reduction factor of the exposure tool introduces certain confusion in referring to "the dimension" of the exposure process. Herein, features sizes and dimensions refer to wafer-level feature sizes and dimensions, and the "minimum feature size" refers to a minimum feature at the wafer level.

For an exposure process to pattern a device correctly, the CDs of all critical structures in the device must be patterned to achieve the design target dimensions. Since it is practically impossible to achieve every target CD with no errors, the device is designed with a certain tolerance for CD errors. In this case, the pattern is considered to be acceptable if the CDs of all critical features are within these predefined tolerances. For the exposure process to be viable in a manufacturing environment, the full CD distribution must fall within the tolerance limits across a range of process conditions that represents the typical range of process variations expected to occur in the fab. For example, the actual doses of nominally identical process conditions can vary up to ±5% from the nominal dose; the actual focal planes of nominally identical process conditions can vary up to ±100 nm from the nominal focal plane.

Factors that limit or degrade the fidelity of the pattern transfer process include imperfections in the mask-making process, in the projection optics, in the resist process, and in the control of the interaction between the projected light and the film stacks formed on the wafer. However, even with a perfect mask, perfect optics, a perfect resist system, and perfect substrate reflectivity control, image fidelity becomes difficult to maintain as the dimensions of the features being imaged become smaller than the wavelength of light used in the exposure tool. For exposure processes using 193 nm illumination sources, features as small as 65 nm are desired. In this deep sub-wavelength regime, the pattern transfer process becomes highly non-linear, and the dimensions of the final pattern at the wafer level become a very sensitive function not only of the size of the pattern at the mask level, but also of the local environment of the feature, where the local environment extends out to a radius of roughly five to ten times the wavelength of light. Given the very small feature sizes compared to the wavelength, even identical structures on the mask will have different wafer-level dimensions depending on the sizes and proximities of neighboring features, and even features that are not immediately adjacent but still within the proximity region defined by the optics of the exposure tool. These optical proximity effects are well known in the literature.

In an effort to improve imaging quality and minimize high non-linearity in the pattern transfer process, current processing techniques employ various resolution enhancement technologies ("RET"). One of the leading types of RETs in use today is optical proximity correction (OPC), a general term for any technology aimed at overcoming proximity effects. One of the simplest forms of OPC is selective bias. Given a CD vs. pitch curve, all of the different pitches could be forced to produce the same CD, at least at best focus and exposure, by changing the CD at the mask level. Thus, if a feature prints too small at the wafer level, the mask level feature would be biased to be slightly larger than nominal, and vice versa. Since the pattern transfer process from mask level to wafer level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. Therefore, the "best" bias to give identical CD vs. pitch may even have a negative impact on the overall process window, reducing rather than enlarging the focus and exposure range within which all of the target features print on the wafer within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the key goals of integrated circuit design and manufacturing is to maximize the number of functional elements while minimizing the area required per chip, adding excess spacing is a highly undesirable solution.

Two-dimensional OPC approaches have been developed to help solve the line end pull back problem. Extra structures (or assist features) known as "hammerheads" or "serifs" are routinely added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a wafer under some or all conditions in the process window. Assist features can take on much more aggressive forms than simple hammerheads added to line ends, to the extent the pattern on the mask is no longer simply the desired wafer pattern upsized by the reduction ratio. Assist features such as serifs can be applied to many more cases than simply reducing line end pull back. Inner or outer serifs can be applied to any edge, especially two dimensional edges, to reduce corner rounding or edge extrusions. With enough selective biasing and assist features of all sizes and polarities, the features on the mask bear less and less of a resemblance to the final pattern desired at the wafer level. In general, the mask pattern becomes a pre-distorted version of the wafer-level pattern, where the distortion is intended to counteract or reverse the pattern deformation that will occur during the lithographic process to produce a pattern on the wafer that is as close to the one intended by the designer as possible.

In another OPC technique, instead of appending to assist structures, such as serifs, whose edges are connected to edges of the main features, completely independent and non-resolvable assist features are added to the mask. The term "independent" here means that edges of these assist features are not connected to edges of the main features. These independent assist features are not intended or desired to print as features on the wafer, but rather are intended to modify the aerial image of a nearby main feature to enhance the printability and process tolerance of that main feature. These assist features (often referred to as "scattering bars" or "SBAR") can include sub-resolution assist features (SRAF) which are features outside edges of the main features and sub-resolution inverse features (SRIF) which are features scooped out from inside the edges of the main features. The presence of SBAR adds yet another layer of complexity to a mask. FIG. 2 shows an exemplary main feature, an exemplary SRAF and an exemplary SRIF. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the mask level.

Many of these OPC techniques can be used together on a single mask with phase-shifting structures of different phases added in as well for both resolution and process window enhancement. The simple task of biasing a one-dimensional line becomes increasingly complicated as two-dimensional structures must be moved, resized, enhanced with assist features, and possibly phase-shifted without causing any conflict with adjoining features. Due to the extended proximity range of deep sub-wavelength lithography, changes in the type of OPC applied to a feature can have unintended consequences for another feature located within half a micron to a micron. Since there are likely to be many features within this proximity range, the task of optimizing OPC decoration becomes increasingly complex with the addition of more aggressive approaches. Each new feature that is added has an effect on other features, which then can be re-corrected in turn, and the results can be iterated repeatedly to converge to a mask layout where each feature can be printed in the manner in which it was originally intended while at the same time contributing in the proper manner to the aerial images of its neighboring features such that they too are printed within their respective tolerances.

SUMMARY

Described herein is a method for obtaining a preferred layout for a lithographic process, the method comprising: identifying an initial layout including a plurality of features; and reconfiguring the features until a termination condition is satisfied, thereby obtaining the preferred layout; wherein the reconfiguring comprises evaluating a cost function that measures how a lithographic metric is affected by a set of changes to the features for a plurality of lithographic process conditions, and expanding the cost function into a series of terms at least some of which are functions of characteristics of the features.

DETAILED DESCRIPTION

According to certain aspects of the invention, the present inventors recognize that due to the complexity and mutual interaction between features, many techniques can be used to describe how to prioritize the optimization routines so that the most critical structures are best protected from unintended distortion by nearby OPC assist features on neighboring features, how to resolve phase and placement conflicts between features, how to trade off computational speed versus ultimate convergence of the resulting feature to the desired results, and other details of the full implementation of OPC as a manufacturable technology.

Figure 3:
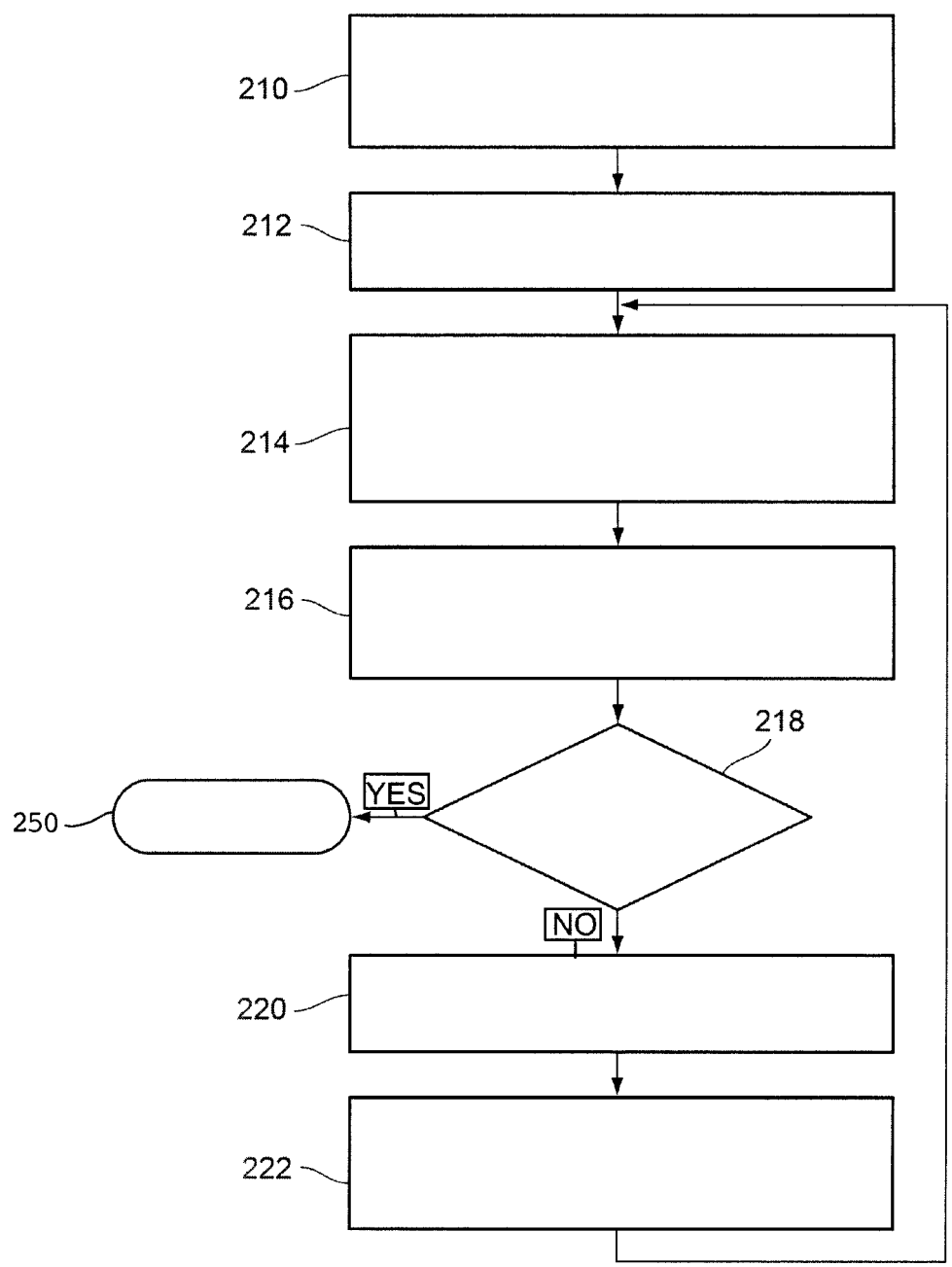
FIG. 3 is a flowchart of method steps for model-based OPC.

OPC can adopt a rule-based approach or a model-based approach. In rule-based OPC, assist features include SBAR can be added to main features empirically. For example, same serifs can be added to all lines without subsequently verifying the effect thereof. In model-based OPC, both the effect of the exposure tool on the aerial image and the effect of the resist processing are modeled mathematically. FIG. 3 is a flowchart showing a typical model-based OPC design process. In step 210, a pre-OPC layout, an OPC technology file, an optical model, and a resist model are obtained. The OPC technology file describes the types of model-based OPC techniques that are to be used, for example linewidth bias corrections, corner rounding corrections, or line end pull back corrections. The optical model describes the illumination and projection optics of the exposure tool. The optical model may also include the effect of imaging into a thin-film resist or the effect of the mask topography. The resist model describes the changes in the resist after being illuminated by the mask pattern in the exposure tool. An etch model may also be used in the method of FIG. 3. The optical, resist, and etch models can be derived from first principles, determined empirically from experimental data, or a combination of both. The models are usually calibrated at the nominal process condition. See R. Socha, "Resolution Enhancement Techniques", Photomask Fabrication Technology, Benjamin G. Eynon, Jr. and Banqiu Wu, Editors, McGraw-Hill, pp. 466-468, 2005. The pre-OPC layout, the OPC technology file, and the models are all inputs to the model-based OPC software.

Figure 4:
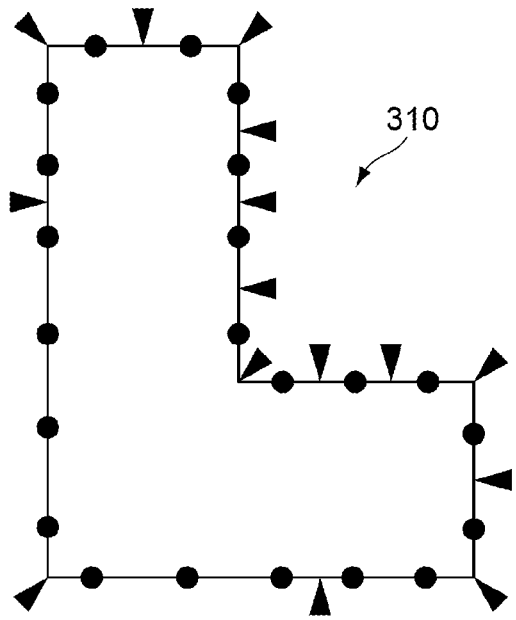
FIG. 4 is a diagram of a feature and an assumed simulated resist image showing edge placement errors.

In step 212, the model-based OPC software dissects the features in the pre-OPC layout into edge segments and assigns control points to each edge segment. Each feature is dissected prior to applying any OPC techniques because each feature, even identically-shaped features, will be subject to different proximity environments. The control points (or evaluation points) are the locations where CD or edge placement errors (EPE) will be evaluated during the OPC design process. The assignment of the control points is a complex process that depends on the pattern geometry of the pre-OPC layout and the optical model. FIG. 4 shows an L-shaped feature 310 with dissection points represented by triangles and assigned control points represented by circles.

In step 214, the model-based OPC software simulates the printed resist image on the wafer by applying the optical model and the resist model to the pre-OPC layout. In general, the simulation is performed at the nominal process condition at which the optical model has been calibrated. In step 216, the model-based OPC software generates the contours of the simulated resist image by comparing the simulated resist image values to a predetermined threshold value. The model-based OPC software then compares the simulated contours with the pre-OPC layout at all of the control points to determine if the design layout will deliver the desired patterning performance. The comparisons are typically quantified as a CD or an EPE at each control point. In step 218, the model-based OPC software determines whether a figure of merit for the contour metric of each edge segment is satisfied. In one embodiment, the figure of merit is satisfied when the total error for the contour metric, e.g., CD or EPE, of each edge segment is minimized. In another embodiment, the figure of merit is satisfied when the total error for the contour metric of each edge segment is below a predetermined threshold. If the figure of merit is satisfied the process ends at step 250, but if the figure of merit is not satisfied, the process continues with step 220.

Figure 1:
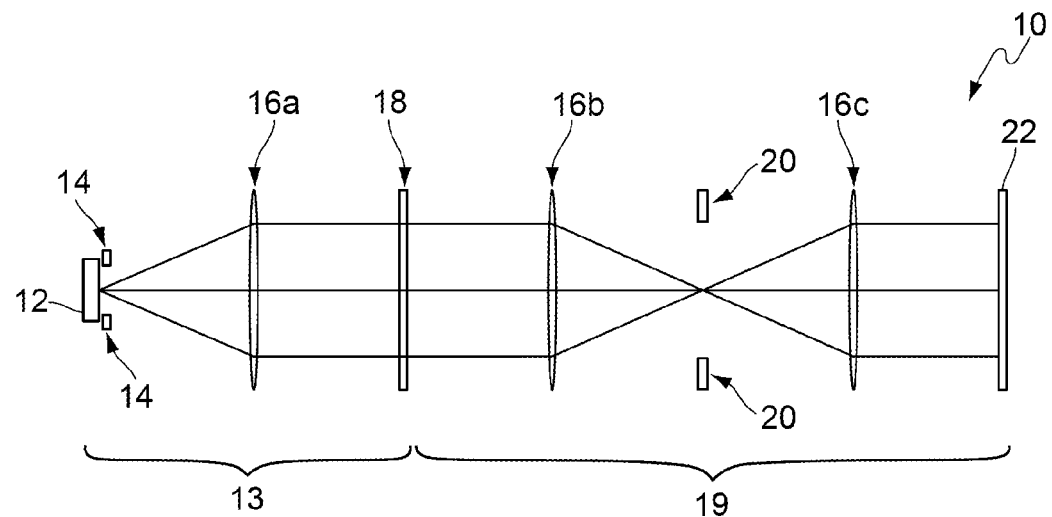
FIG. 1 is a diagram of one embodiment of a lithography system.
Figure 2:
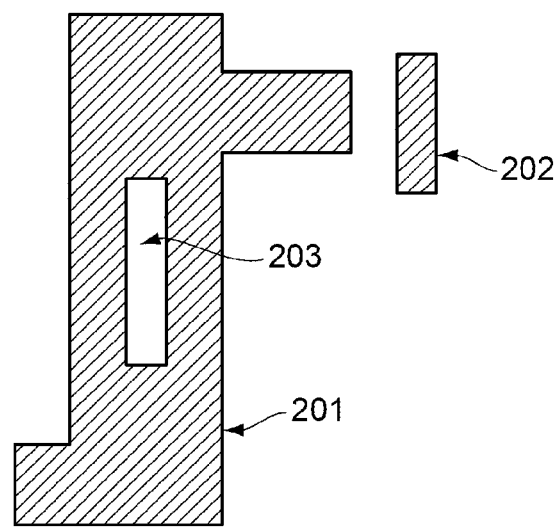
FIG. 2 shows an exemplary main feature, an exemplary SRAF and an exemplary SRIF.
Figure 5:
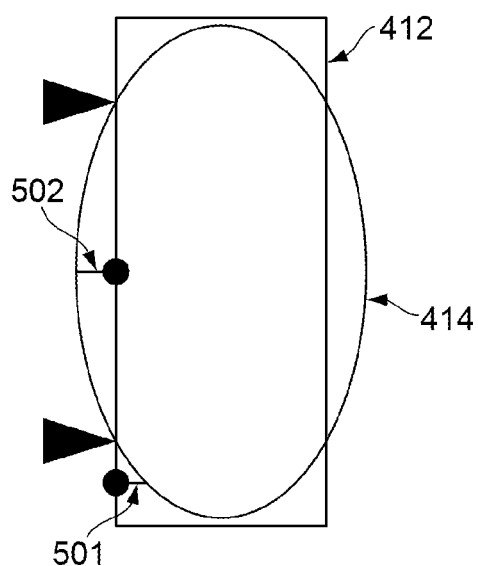
FIG. 5 is a diagram of a feature and an assumed simulated resist image showing edge placement errors.

FIG. 5 shows two EPEs with opposite signs measured at two control points. If an assumed simulated resist image contour 414 does not overlap the feature's designed geometry 412 at the control point, then the EPE is determined based on the difference at that control point. Returning to FIG. 2, in step 220 the model-based OPC software calculates the edge correction amount at each control point. If it is assumed that the EPE of the i-th edge segment ($E_i$) is $\Delta L_i$ determined at control point $C_i$, the simplest edge correction amount $\Delta L_i$ is a negation of the error: $\Delta L_i = -\Delta L_i$. Such a straightforward correction function does not work well for non-linear processes because changes on the mask are not linearly reflected in the printed resist image. To account for nonlinearities such as the mask error factor (MEF), a slightly more complicated correction function can be used:

$$\Delta L_i = -\frac{\Delta E_i}{MEF}.$$

Application of the method of calculating the appropriate correction in a production mask is quite complex, and the correction algorithms can depend on factors such as linewidth error, fabrication process, correction goals, and constraints. See A. K. Wong, Resolution Enhancement Techniques in Optical Lithography, SPIE Press, pp. 91-115, 2001. For example, if it is assumed that there are N edge segments of a feature and one control point for each edge segment, and that the correction amount for the i-th edge segment is $\Delta L_i$ the ultimate goal is to solve for $\Delta L_1$, $\Delta L_2, \ldots, \Delta L_N$, such that the difference between resist image values $RI(C_i)$ and the predetermined threshold values T at all control points are equal to zero as: $RI(C_i) - T = 0$ for $i = 1, \ldots, N$, where $C_i$ are the control points. Or minimize the function $$\sum_{i=1}^{N} [RI(C_i) - T]^2.$$

Next, in step 222, the model-based OPC software adjusts the entire edge segment $E_i$ according to the calculated correction amount $\Delta L_i$ for all edge segments to produce a post-OPC layout, such that the simulated resist image contour moves to match the design geometry. Then the method returns to step 214, where the model-based OPC software simulates a resist image using the post-OPC layout produced in step 222. The resist image contours and error are then calculated for the simulated resist image produced using the post-OPC layout in step 216. In step 218 the model-based OPC software determines whether a function that measures the EPE is minimized or below a certain threshold. Such a function is usually referred to as a "cost function". An exemplary cost function may be:

$$\sum_{i=1}^{N} [\Delta E_i]^2.$$

Another exemplary cost function may be the maximum EPE of all segments, i.e., $$\max_{i=1,\ldots,N} |\Delta E_i|$$

since the OPC goal may be set such that all EPE must be below a certain threshold.

Figure 6A:
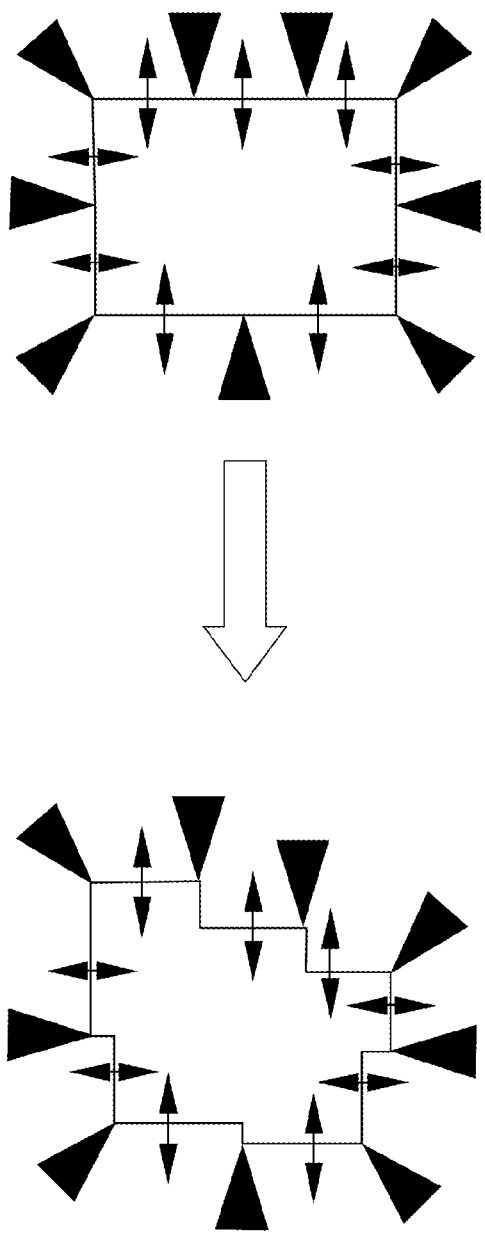
FIG. 6A shows movements of segments of the edges of an exemplary main feature and an exemplary assist feature.

According to an embodiment, the edges of the main features and assist features may be split into a plurality of segments. During the process of finding preferred locations and shapes of the main features and assist features that satisfy a certain condition, such as a resist image produced matches a preferred resist image, each segment may be moved in a direction perpendicular thereto. According to an embodiment, the segments of the assist features may be moved without moving the segments of the main features or vice versa. As shown in the diagram in FIG. 6A, each segment can also be shifted in a direction parallel thereto as a result of movement of nearest neighboring segments connected thereto. However, the location of each segment in the direction perpendicular thereto is sufficient to dictate changes to the shapes and locations of the main features and assist features. For clarity, during this process, the location of each segment in the direction perpendicular thereto is denoted as $CV_k$, $k=1, \ldots, M$, wherein M is the total number of segments on the mask or a portion of the mask. For convenience, a vector CV is defined as $$CV = \begin{pmatrix} CV_1 \\ CV_2 \\ \vdots \\ \vdots \\ CV_M \end{pmatrix}.$$

The location of each segment can also be represented as a change relative to the initial location of the segment. Namely, $dCV_k = CV_k - CV_k^0$, wherein $CV_k^0$ is the initial location of the k-th segment and $dCV_k$ is the change relative to the initial location $CV_k^0$. For convenience, vectors $CV^0$ and $dCV$ are defined as $$CV^0 = \begin{pmatrix} CV_1^0 \\ CV_2^0 \\ \vdots \\ \vdots \\ CV_M^0 \end{pmatrix} \text{ and } dCV = \begin{pmatrix} dCV_1 \\ dCV_2 \\ \vdots \\ \vdots \\ dCV_M \end{pmatrix} \cdot CV = CV^0 + dCV.$$

A plurality of evaluation points can be placed on the mask. These evaluation points can be placed on the edges of the main features or off the edges of the main features such as at corners of the main features. Each segment can have any number (including zero) evaluation points thereon. EPE can be evaluated for each of these evaluation points and for a plurality of process conditions using a suitable model that simulate the resist image from the main and assist patterns, characteristics of the source, characteristics of the resist and other parameters of the lithography process. For convenience, a vector EPE is defined as $EPE = (EPE_1(CV)\ EPE_2(CV) \ldots \ldots EPE_N(CV))$, wherein N is the total number of EPEs evaluated. Each of these EPEs is a function of the vector CV. Alternatively, each of these EPEs can be written as a function of the vector dCV as dCV differs from CV by a constant vector $CV^0$. For example, if there are 4 evaluation points on a mask, and an EPE is evaluated for each of these 4 evaluation points at each of 2 process conditions, the vector EPE includes $N=4\times2=8$ items. A Jacobian matrix J of the EPE vector with respect to the CV vector can be defined as $$J = \begin{pmatrix} \frac{\partial EPE_1}{\partial CV_1} & \frac{\partial EPE_1}{\partial CV_2} & \cdots & \cdots & \frac{\partial EPE_1}{\partial CV_M} \\ \frac{\partial EPE_2}{\partial CV_1} & \frac{\partial EPE_2}{\partial CV_2} & \cdots & \cdots & \frac{\partial EPE_2}{\partial CV_M} \\ \vdots & \vdots & \ddots & & \vdots \\ \vdots & \vdots & & \ddots & \vdots \\ \frac{\partial EPE_N}{\partial CV_1} & \frac{\partial EPE_N}{\partial CV_2} & \cdots & \cdots & \frac{\partial EPE_N}{\partial CV_M} \end{pmatrix},$$

wherein J has N rows and M columns.

An exemplary cost function that measures how a lithographic metric such as the resist image is affected by changes to the main features and assist features characterized by CV or dCV can be defined as $$CF = \sum_{i=1}^{N} EPE_i^2 = EPE \cdot EPE^T. \quad \text{(Eq. 1)}$$

The lithographic metric can be edge placement error, critical dimension uniformity, dose variation, focus variation, process condition variation, mask error (MEEF), mask complexity, resist contour distance, worst defect size, best focus shift, and mask rule constraint.

Figure 6B:
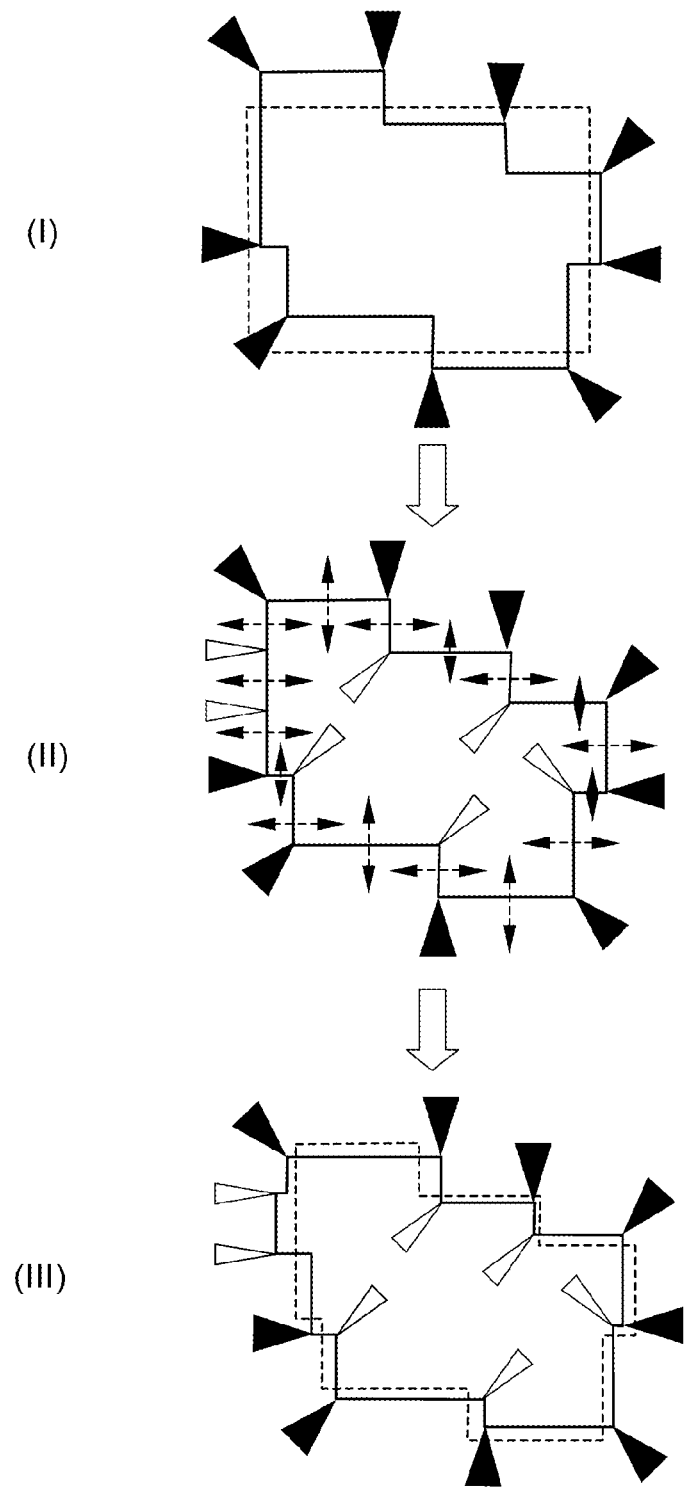
FIG. 6B shows that additional dissecting points may be added to the feature in FIG. 6A.
Figure 6C:
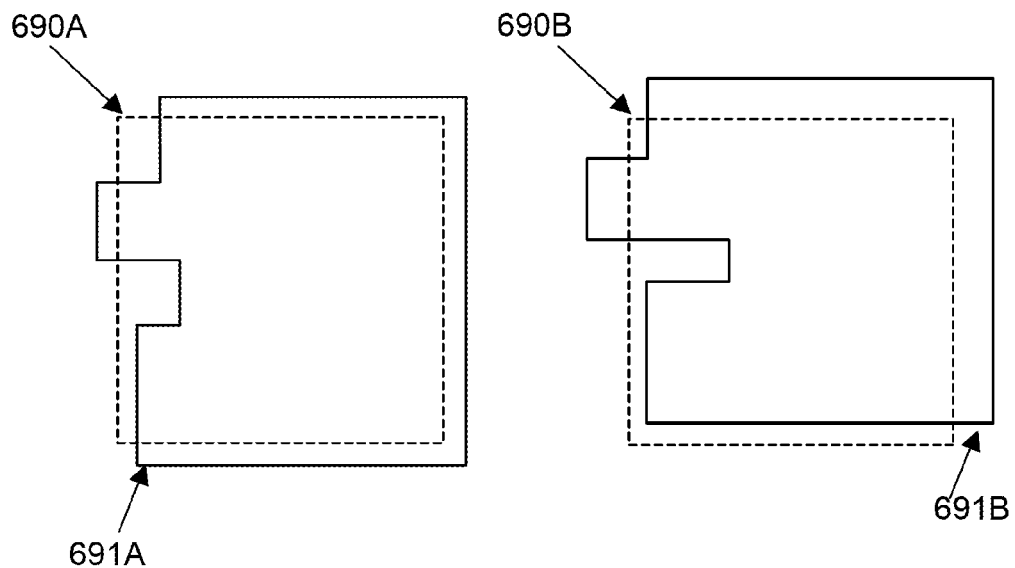
FIG. 6C illustrates a metric that measures difference between reconfiguration of a feature in one die and a corresponding feature in another die.

Another example of the lithographic metric is a metric that measures difference between reconfiguration of a feature in one die and a corresponding feature in another die. This metric may be referred to as "geometry symmetry edges correction value" or GSECV. For example, FIG. 6C illustrates two square features 690A and 690B in two different dies; the two square features 690A and 690B correspond to each other. After reconfiguration, the two square features 690A and 690B become the features 691A and 691B, respectively GSECV can measure the difference between the features 691A and 691B. For example, GSECV may be defined as the difference between the areas of the features 691A and 691B. Of course, other definitions of GSECV are possible.

It should be appreciated that CF may have other suitable forms such as $$CF = \sum_{i=1}^{N} EPE_i^4, \; CF = \sum_{i=1}^{N} |EPE_i|, \; CF = \max_{i=1,\ldots,N} |EPE_i|$$

or a combination thereof.

The cost function can be minimized (or maximized for a cost function of certain form, such as $$CF = -\sum_{i=1}^{N} EPE_i^2)$$

using any suitable method such as the Gauss-Newton algorithm, the interpolation method, the Levenberg-Marquardt algorithm, the gradient descent algorithm, simulated annealing, the interior point method, the genetic algorithm, solving polynomials, including higher-order polynomials of the CV or dCV.

According to an embodiment, the cost function of Eq. 1 can be minimized by the following iterative process. In the q-th iteration wherein CV take values of $CV^q$, the cost function of Eq. 1 is expanded into derivatives of the lithographic metric with respect to characteristics (e.g., CV) of the main features and the assist features, for example as shown in Eq. 2 below, wherein the cost function is expanded using the Jacobian matrix:

$$CF(CV) = CF(CV^q) + 2 \cdot EPE \cdot J \cdot dCV + dCV^T \cdot J^T \cdot J \cdot dCV + \quad \text{(Eq. 2)}$$
$$\sum_{j,k} dCV_j dCV_k \sum_i EPE_i \frac{\partial^2 EPE_i}{\partial CV_j \partial CV_k} + O(\|dCV\|^3).$$

The cost function can be approximated by omitting terms with derivatives above a predetermined order, such as the third order derivative term and above, i.e., the last term of Eq. 2. The approximated cost function can then be minimized by quadratic programming. Specifically, a value of dCV that yields a minimum of CF in the vicinity of $CV^q$, which is denoted as $dCV^q$, can be derived by omitting the last term of Eq. 2 and solving M linear equations of $$\frac{\partial CF}{\partial CV_k} = 0.$$

CV takes the value of $(CV^q + dCV^q)$ in the (q+1)-th iteration: $CV^{(q+1)} = (CV^q + dCV^q)$. This iteration continues until convergence (i.e. CF does not reduce any further) or a preset number of iterations is reached or a preset amount of time has passed. It should be appreciated that the cost function can be expanded in any other suitable manner. The Jacobian matrix can be calculated in every iterative step, or calculated in one iterative step and used in several succeeding iterative steps.

According to an embodiment, the cost function can be expanded in any other suitable ways. For example, the cost function can be expanded into Taylor series, Fourier series, wavelets, frames, sinc functions, Gaussian functions, etc.

In an embodiment, the cost function CF can include terms that measure relative alignment (i.e. relative position) of at least a pair of features selected from the main features and the assist features. The pair of features can include a main feature and an assist feature, two main features, or two assist features. Minimizing such a cost function can reduce the amount of relative movement between the pair of features. For example, the cost function can be $$CF = \sum_{i=1}^{N} EPE_i^2 + w \cdot \sum (dCV_p - dCV_q)^2, \quad \text{(Eq. 3)}$$

wherein the second summation includes all pairs of segments whose relative alignment is to be reduced, and weight w is a constant.

The cost function of Eq. 3 can be minimized by any suitable method including the iterative method above, i.e., iterative steps of expansion with respect to CV, omitting the third and higher derivatives, solving M linear equations of $$\frac{\partial CF}{\partial CV_k} = 0.$$

In an embodiment, the cost function CF can include terms that measure the magnitudes of the changes to the main features and the assist features from the initial layout. For example, the cost function can be $$CF = \sum_{i=1}^{N} EPE_i^2 + \sum_{k} \alpha_k \|dCV_k\|^2, \quad \text{(Eq. 4)}$$

wherein $\alpha_k$ are weight constants.

The cost function in Eq. 4 can be minimized by any suitable method including the iterative method above, i.e., iterative steps of expansion with respect to CV, omitting the third and higher derivatives, solving M linear equations of $$\frac{\partial CF}{\partial CV_k} = 0.$$

In an embodiment, the lithographic process and the mask making process can be under various physical limitations. These limitations manifest as constraints in minimization or maximization of the cost function. In one example, dCV in an iterative step can be limited to be within a certain range. In one example, an EPE in an iterative step can be limited to be within a certain range. In one example, the resist image in an iterative step can be limited to be within a certain range. In another example, change of the distance between a pair of segments from an iterative step to the next can be limited to a certain range. The cost function under constraints can be minimized or maximized using any suitable constrained optimization methods.

Figure 6D:
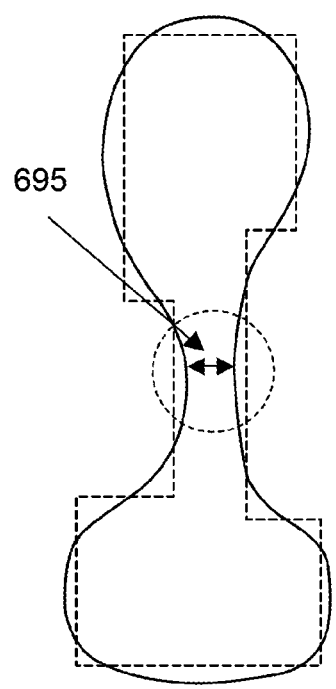
FIG. 6D illustrates the necking constraint.
Figure 6E:
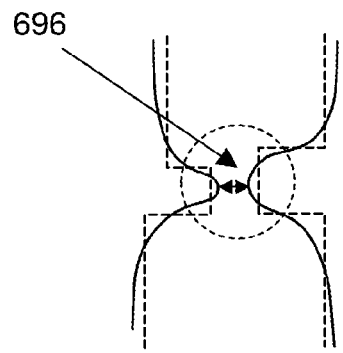
FIG. 6E illustrates the bridging constraint.

One constraint is called "necking constraint." The necking constraint is a lower bound to a width at any location of a resist image produced from a feature. For example, FIG. 6D illustrates a "neck" 695. The dotted line represents the feature; the curved solid line represents the resist image produced from this feature. If the neck 695 is narrower than the lower bound, the neck 695 is likely to break. Another constraint is called "bridging constraint." The bridging constraint is a lower bound to a spacing between any edges of a resist image produced from one or more features. For example, FIG. 6E illustrates a "bridge" 696 between two features. The dotted line represents the features; the curved solid line represents the resist image produced from these features. If the bridge 696 is smaller than the lower bound, the edges are likely to merge.

In a mathematical form, such the cost function can include terms characteristic of these ranges. For example, if any function $f_z(dCV)$ of dCV at an iterative step is to be limited within a range from $b_z$ to $t_z$ and it is desired to minimize $|b_z|$ and $|t_z|$, the cost function can be $$CF = \sum_{i=1}^{N} EPE_i^2 + \sum_{z} (\beta_z b_z^2 + \gamma_z t_z^2), \quad \text{(Eq. 5)}$$

wherein $\beta_z$ and $\gamma_z$ are weight constants. Minimizing this cost function of Eq. 5 yields dCV that give minimal EPE, $|b_z|$ and $|t_z|$ at the same time. The function $f_z(dCV)$ can be, for example, EPE, resist image, change of the distance between a pair of segments or any other suitable function of dCV.

In an embodiment, the cost function can include EPEs evaluated at process conditions farthest from a nominal condition. For example, the nominal condition is denoted as a pair of dose and focus values (d0, f0). In a production lithographic process wherein the largest expected deviation from the nominal condition is dd and df for dose and focus respectively (namely, the dose is expected not to go beyond d0±dd and the focus is expected not to go beyond f0±df), the cost function can include EPEs evaluated at one or more process conditions selected from (d0, f0), (d0+dd, f0+df), (d0+dd, f0−df), (d0−dd, f0+df), (d0−dd, f0−df), (d0, f0+df), (d0, f0−df), (d0+dd, f0), (d0−dd, f0).

Figure 6F:
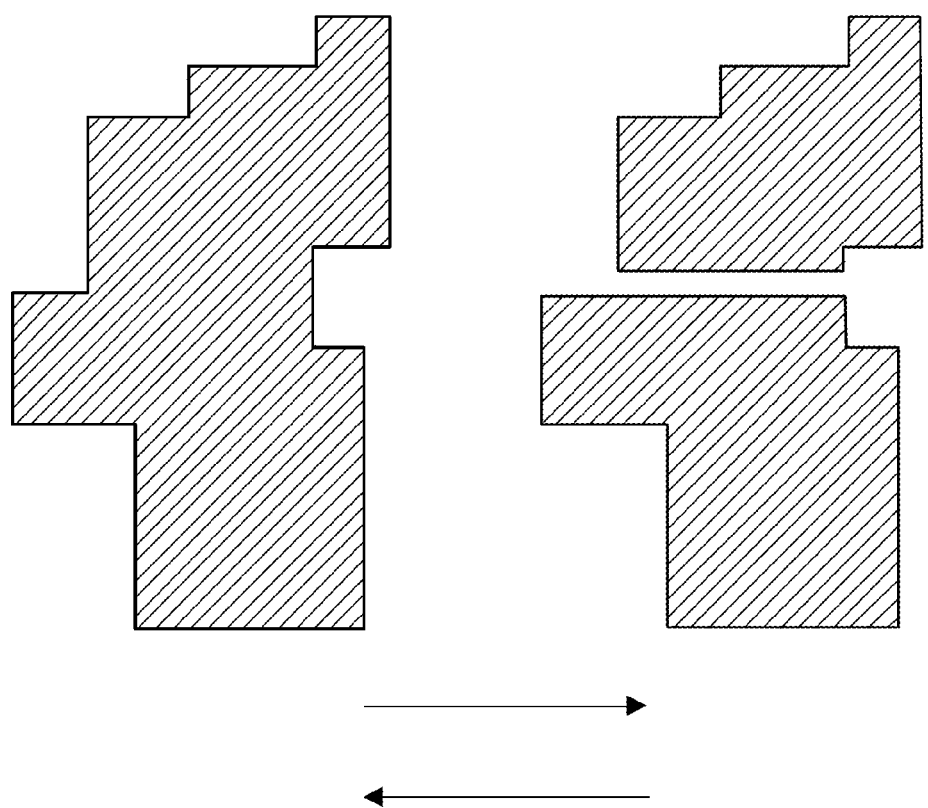
FIG. 6F illustrates that one feature is broken into two discrete features or two discrete features are joined into one feature.
Figure 7:
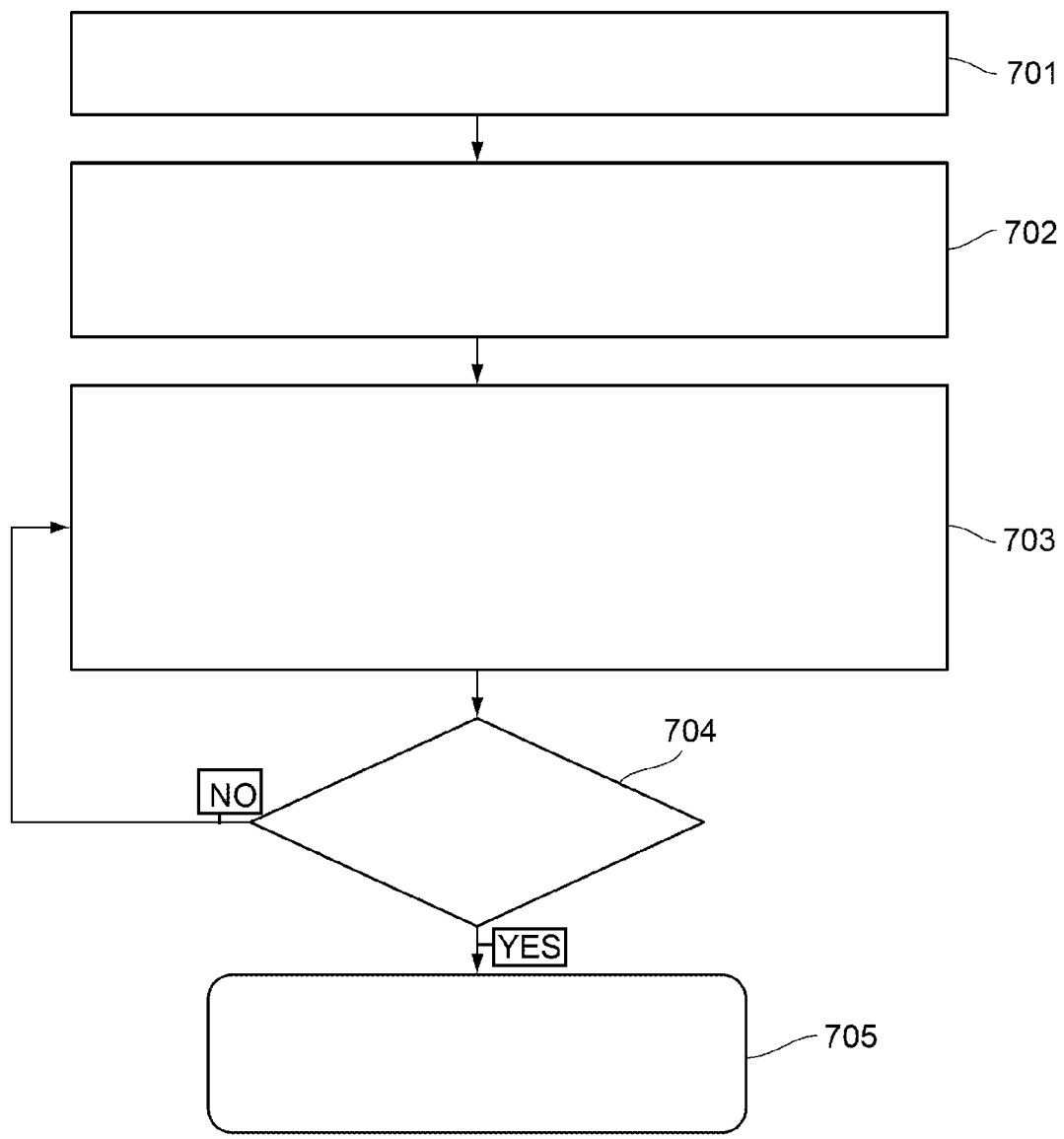
FIG. 7 shows an exemplary flowchart of the method for obtaining a preferred layout for a lithographic process, according to an embodiment.

FIG. 7 shows an exemplary flowchart of a method for obtaining a preferred layout for a lithographic process, according to an embodiment. In step 701, an initial layout including a plurality of main features is identified. In step 702, a plurality of assist features that may include SRAF and SRIF are added to the initial layout according to one or more predetermined rules and models of the lithographic process. Such rules can be empirical rules or rules based on characteristics of the initial layout without involving simulation. Such models can describe the illumination and projection optics of the exposure tool and may also include the effect of the mask topography, characteristics of the resist on the wafer, characteristics of the etching process of the thin metal film on the mask. In step 703, the main features and the assist features are simultaneously reconfigured such as changing shapes and locations thereof, and the effect of the reconfiguration is manifested by a cost function that measures how a lithographic metric such as EPE is affected by the reconfiguration under a plurality of lithographic process conditions. In an embodiment, the reconfiguration may include further dissecting the features. In the example illustrated in FIG. 6B, panel (I) shows the feature in FIG. 6A after the segments of the feature are moved. Additional dissection points (open triangles in panels (II)) may be added to split some of the segments into additional segments. All the segments of this feature may be used to further reconfigure the feature if step 703 is repeated. In an embodiment, as illustrated in FIG. 6F, the reconfiguration may include breaking at least one of the features into discrete features or joining at least two of the features into one. In step 704, satisfaction of a termination condition is assessed. The termination condition can be minimization or maximization of the cost function with or without constraints, a predetermined number of iteration, or a predetermined amount of time elapsed. If the termination condition is satisfied, the current configuration of the main features and the assist features are taken as the preferred layout. If the termination condition is not satisfied, steps 703 and 704 are repeated. If the termination condition is satisfied, the method ends at step 705. The forms of the cost function and the methods of reconfiguring the features disclosed herein may be used when reconfiguring a relatively large area of the layout even up to a full mask as the forms and the methods may reduce the time required for the reconfiguration of the layout to obtain the preferred layout. The terms "simultaneous reconfiguring" of a plurality of features and "simultaneously reconfiguring" a plurality of features as used herein mean that the plurality of features are allowed to change at the same time.

In an embodiment, a method for obtaining a preferred layout for a lithographic process, comprises: identifying an initial layout including a plurality of features; and reconfiguring the features until a termination condition is satisfied, thereby obtaining the preferred layout; wherein the reconfiguring comprises evaluating a cost function that measures how a lithographic metric is affected by a set of changes to the features for a plurality of lithographic process conditions, and expanding the cost function into a series of terms at least some of which are functions of characteristics of the features; wherein the reconfiguring is performed under constraints dictating a range of at least some of the changes to the features. The constraints may comprise one or more necking constraints. The constraints may comprise one or more bridging constraints. Reconfiguring the features may comprise dissecting boundaries of the features into segments. Reconfiguring the features may comprise breaking one of the features into at least two discrete features or joining at least two discrete features into one feature.

In an embodiment, a method for obtaining a preferred layout for a lithographic process, comprises: identifying an initial layout including a plurality of features; dissecting one or more features of the plurality of features into segments, reconfiguring the one or more features by moving the segments, repeating the dissecting and reconfiguring steps at least once.

In an embodiment, a method for obtaining a preferred layout for a lithographic process, comprises: identifying an initial layout including a plurality of features; breaking at least one feature of the plurality of features into discrete features or joining at least two features of the plurality of features into one feature, reconfiguring the one or more features by moving the segments, repeating the dissecting or joining step and the reconfiguring step at least once.

Figure 8:
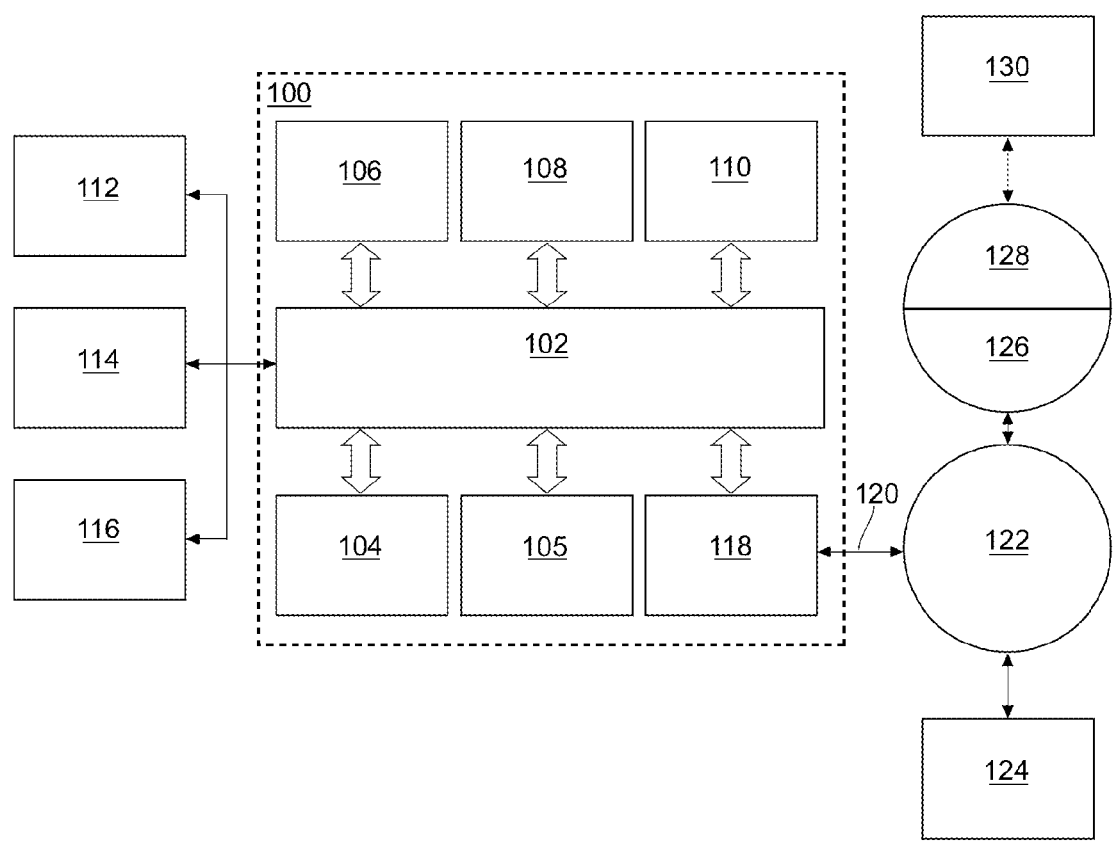
FIG. 8 is a block diagram that illustrates a computer system which can assist in the implementation of the simulation method of the present invention.

FIG. 8 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the claimed methods. Thus, the embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with an embodiment, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

Example Lithography Tool

Figure 9:
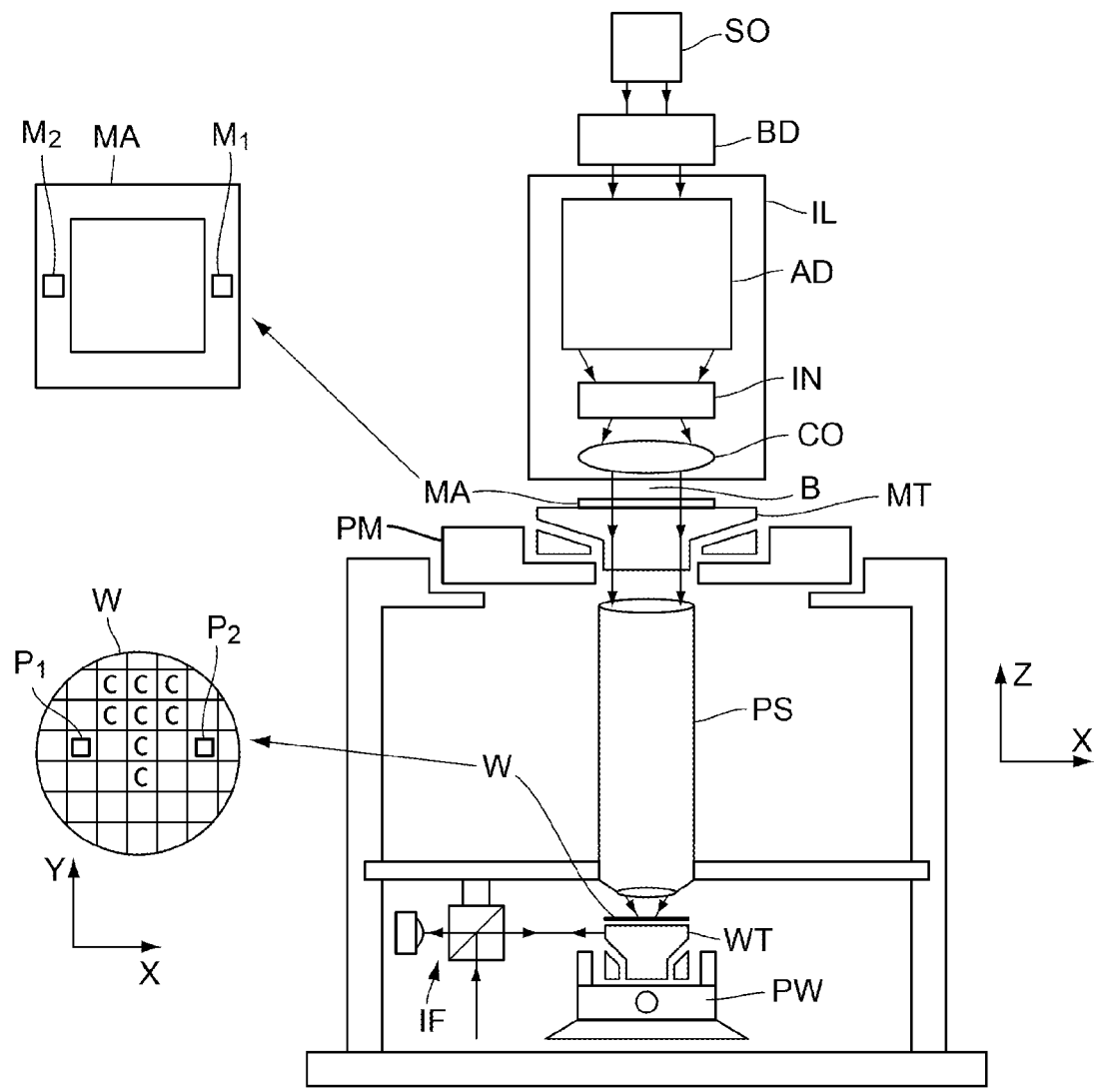
FIG. 9 schematically depicts a lithographic projection apparatus suitable for use with the method of the present invention.

FIG. 9 schematically depicts an exemplary lithographic projection apparatus whose performance could be simulated and/or optimized utilizing the computational lithography models that are calibrated using the test pattern selection process of present invention. The apparatus comprises:

- a radiation system IL, for supplying a projection beam B of radiation. In this particular case, the radiation system also comprises a radiation source SO;
- a first object table (mask table) MT provided with a mask holder for holding a mask MA (e.g., a reticle), and connected to first positioning means PM for accurately positioning the mask with respect to projection system PS;
- a second object table (substrate table) WT provided with a substrate holder for holding a substrate W (e.g., a resist-coated silicon wafer), and connected to second positioning means PW for accurately positioning the substrate with respect to projection system PS;
- a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 9 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan tool) the mask table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:

- In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;
- In scan mode, essentially the same scenario applies, except that a given target portion C is not exposed in a single "flash". Instead, the mask table MT is movable in a given direction (the so-called "scan direction", e.g., the y direction) with a speed v, so that the projection beam B is caused to scan over a mask image; concurrently, the substrate table WT is simultaneously moved in the same or opposite direction at a speed V=Mv, in which M is the magnification of the lens PS (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following clauses:

1. A method for obtaining a preferred layout for a lithographic process, the method comprising:
identifying an initial layout including a plurality of features; and
reconfiguring the features until a termination condition is satisfied, thereby obtaining the preferred layout;
wherein the reconfiguring comprises evaluating a cost function that measures how a lithographic metric is affected by a set of changes to the features for a plurality of lithographic process conditions, and expanding the cost function into a series of terms at least some of which are functions of characteristics of the features.
2. The method of clause 1, wherein expanding the cost function comprises expanding the cost function into derivatives of the lithographic metric with respect to characteristics of the features.
3. The method of clause 2, wherein every reconfiguring step comprises expanding the cost function into derivatives of the lithographic metric with respect to characteristics of the features.
4. The method of clause 1, wherein the termination condition includes one or more of: minimization of the cost function; maximization of the cost function; reaching a preset number of iterations; reaching a value of the cost function equal to or beyond a preset threshold value; reaching a predefined computation time; and, reaching a value of the cost function within an acceptable error limit.
5. The method of clause 4, wherein the cost function is minimized or maximized by a method selected from a group consisting of the Gauss-Newton algorithm, the interpolation method, the Levenberg-Marquardt algorithm, the gradient descent algorithm, simulated annealing, interior point method, and the genetic algorithm.
6. The method of clause 4, wherein the cost function is minimized or maximized by solving polynomials of the changes to the features.
7. The method of clause 4, wherein the cost function is minimized or maximized by solving a quadratic programming problem.
8. The method of clause 1, wherein the reconfiguring is performed under constraints dictating a range of at least some of the changes to the features.
9. The method of clause 8, wherein the constraints include one or more of: tuning ranges, rules governing mask manufacturability, and interdependence among the features.
10. The method of clause 1, wherein the cost function is a function of one or more of the following lithographic metrics: edge placement error, critical dimension uniformity, dose variation, focus variation, process condition variation, mask error (MEEF), mask complexity, resist contour distance, worst defect size, best focus shift, and mask rule constraint.
11. The method of clause 1, wherein expanding the cost function comprises expanding the cost function into Taylor series, Fourier series, wavelets, frames, sinc functions or Gaussian functions.
12. A computer program product comprising a computer readable medium having instructions recorded thereon, the instructions when executed by a computer implementing the method of any of the above clauses.

The descriptions above are intended to be illustrative, not limiting. Thus, it will be apparent to one skilled in the art that modifications may be made to the embodiments as described without departing from the scope of the claims set out below.

What is claimed is:

1. A method to obtain a pattern layout for a lithographic process, the method comprising:
identifying an initial pattern layout including a plurality of features;
performing (i) splitting certain one or more of the features into two or more discrete features, or (ii) joining two or more of the features into a single feature, or (iii) both (i) and (ii);
reconfiguring the features with a set of changes to the features; and
determining if a termination condition is satisfied with respect to the set of changes to the features, thereby obtaining an electronic data representation of a desired pattern layout for patterning a substrate using a lithographic process;
wherein the determining comprises evaluating, by a hardware computer, a cost function that measures how a lithographic metric is affected by the set of changes to the features for a plurality of lithographic process conditions, and expanding the cost function into a series of terms at least some of which are functions of one or more characteristics of the features.
2. The method of claim 1, wherein expanding the cost function comprises expanding the cost function into derivatives of the lithographic metric with respect to the one or more characteristics of the features.
3. The method of claim 2, wherein the determining comprises omitting one or more terms with a derivative above a predetermined order from the expanded cost function.
4. The method of claim 1, wherein the features that are reconfigured include one or more main features and one or more assist features.
5. The method of claim 1, wherein the features include one or more sub-resolution assist features (SRAF) and/or one or more sub-resolution inverse features (SRIF).

6. The method of claim 4, wherein the reconfiguring comprises simultaneously reconfiguring the one or more main features and the one or more assist features.

7. The method of claim 1, further comprising adding a plurality of assist features to the initial layout using a predetermined rule and/or a model of the lithographic process.

8. The method of claim 1, wherein the determining comprises calculating a Jacobian matrix.

9. The method of claim 1, wherein the determining comprises expanding the cost function using a Jacobian matrix.

10. The method of claim 1, wherein the one or more characteristics of the features are the set of changes to the features.

11. The method of claim 1, wherein the set of changes includes movement of one or more segments of a boundary of one or more of the features.

12. The method of claim 1, wherein the set of changes includes a change of a shape of one or more of the features.

13. The method of claim 1, wherein the set of changes includes a change of a location of one or more of the features.

14. The method of claim 1, wherein the cost function comprises a function of at least one selected from:
    relative alignment of at least a pair of the features,
    magnitude of the change to one or more of the features from the initial layout, and
    a characteristic of a resist image or an aerial image.

15. The method of claim 1, wherein the cost function comprises a function of a probability of a function of the features and a process window defined by the plurality of lithographic process conditions having a value outside a permitted range.

16. The method of claim 15, wherein the plurality of lithographic process conditions comprise a plurality of different focus and dose values.

17. The method of claim 2, wherein the derivatives are reused in one or more reconfiguring steps succeeding the reconfiguring.

18. The method of claim 1, wherein the termination condition includes one or more selected from: minimization of the cost function; maximization of the cost function; reaching a preset number of iterations; reaching a value of the cost function equal to or beyond a preset threshold value; reaching a predefined computation time; and/or reaching a value of the cost function within an acceptable error limit.

19. The method of claim 1, wherein the reconfiguring is performed under a constraint dictating a range of at least some one of the changes to the features.

20. The method of claim 1, wherein the cost function comprises a function of one or more selected from the following: edge placement error, critical dimension uniformity, dose variation, focus variation, process condition variation, mask error (MEEF), mask complexity, resist contour distance, worst defect size, best focus shift, and/or mask rule constraint.

21. The method of claim 1, wherein reconfiguring includes:
    dissecting a feature into a plurality of segments, and
    moving one or more of the segments of the feature independently from one or more other of the segments of the feature.

22. The method of claim 21, further comprising:
    placing evaluation points on the segments,
    wherein determining includes evaluating the cost function over all of the evaluation points.

23. A non-transitory computer program product comprising a computer readable storage medium having instructions recorded thereon, the instructions when executed by a computer implementing a method to obtain a pattern layout for a lithographic process, the method comprising:
    identifying an initial pattern layout including a plurality of features;
    performing (i) splitting certain one or more of the features into two or more discrete features, or (ii) joining two or more of the features into a single feature, or (iii) both (i) and (ii);
    reconfiguring the features with a set of changes to the features; and
    determining if a termination condition is satisfied with respect to the set of changes to the features, thereby obtaining an electronic representation of a desired pattern layout for patterning a substrate using a lithographic process;
    wherein the determining comprises evaluating, by the computer, a cost function that measures how a lithographic metric is affected by the set of changes to the features for a plurality of lithographic process conditions, and expanding the cost function into a series of terms at least some of which are functions of one or more characteristics of the features.

24. The computer program product of claim 23, wherein the features that are reconfigured include one or more main features and one or more assist features.

25. The computer program product of claim 24, wherein the reconfiguring comprises simultaneously reconfiguring the one or more main features and the one or more assist features.

* * * * *